(12) United States Patent
Ota

(10) Patent No.: US 6,770,912 B2
(45) Date of Patent: Aug. 3, 2004

(54) SEMICONDUCTOR DEVICE AND METHOD FOR PRODUCING THE SAME

(75) Inventor: Yorito Ota, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/079,951

(22) Filed: Feb. 19, 2002

(65) Prior Publication Data

US 2002/0113240 A1 Aug. 22, 2002

(30) Foreign Application Priority Data

Feb. 22, 2001 (JP) ......................................... 2001-047000

(51) Int. Cl.[7] .......................... H01L 29/06; H01L 29/04; H01L 31/036
(52) U.S. Cl. ............................. 257/77; 257/19; 257/63; 257/65; 257/54; 257/55
(58) Field of Search .......................... 257/19, 63, 65, 257/77, 54, 55

(56) References Cited

U.S. PATENT DOCUMENTS

| | | |
|---|---|---|
| 4,762,806 A | 8/1988 | Suzuki et al. |
| 5,270,554 A | 12/1993 | Palmour |
| 5,557,118 A * | 9/1996 | Hashimoto ................... 257/197 |
| 5,905,277 A | 5/1999 | Ota et al. |
| 6,154,475 A * | 11/2000 | Soref et al. ................... 372/45 |
| 6,221,685 B1 * | 4/2001 | Ichinose et al. .............. 438/48 |

FOREIGN PATENT DOCUMENTS

| | | |
|---|---|---|
| JP | 60-142568 | 7/1985 |
| JP | 5-90572 | 4/1993 |
| JP | 5-102497 | 4/1993 |
| JP | 5-175239 | 7/1993 |
| JP | 6-97107 | 4/1994 |
| JP | 10-321646 | 12/1998 |
| JP | 2000-101099 | 4/2000 |

OTHER PUBLICATIONS

"Nickel and Molybdenum Ohmic Contacts on Silicon Carbide", Institute of Physics Conference Series No. 142, pp 577–580, 1996.

* cited by examiner

*Primary Examiner*—George Eckert
*Assistant Examiner*—Joseph Nguyen

(57) ABSTRACT

A semiconductor device includes a SiC substrate and an ohmic electrode, a semiconductor member including a SiC member and a SiGe member being formed between the SiC substrate and the ohmic electrode, wherein the semiconductor member is composed of a SiGe member formed on a SiC member, and the ohmic electrode is formed on the SiGe member, whereby the ohmic electrode with a low resistance can be formed on the SiC substrate without conducting a heat treatment at a high temperature.

5 Claims, 10 Drawing Sheets

SEMICONDUCTOR DEVICE AND METHOD FOR PRODUCING THE SAME

BACKGROUND OF THE INVENTION

1. Field of the Invention

The present invention relates to a semiconductor device in which an ohmic electrode is formed on a substrate made of silicon carbide with a large bandgap, and a method for producing the same.

2. Description of the Related Art

In recent years, a semiconductor made of silicon carbide (SiC) is drawing attention as a next-generation semiconductor material due to its physical advantage of a wide bandgap and the substantially unlimited availability of its constituent elements. SiC has a crystal structure formed by a covalent bond, so that it is very stable physically and has a large bandgap. Therefore, a Schottky contact can be formed easily on a junction surface between metal and SiC, whereas it is difficult to form an ohmic contact thereon. In order to form an ohmic contact, it is required to select a material appropriately and conduct a heat treatment at a very high temperature.

Hereinafter, a method for forming an ohmic electrode using a conventional construction will be described with reference to the drawings. FIG. 6 is a cross-sectional view showing a configuration of a field-effect transistor that is one of the conventional SiC semiconductor devices. FIGS. 12A to 12D are cross-sectional views illustrating the processes of a method for producing the field-effect transistor. First, as shown in FIG. 12A, a SiC member 62 doped with an impurity in a low concentration, and a SiC member 63 doped with an impurity in a high concentration are formed on the upper surface of a SiC substrate 61 by crystal growth. Then, as shown in FIG. 12B, a part of the SiC member 63 that is the uppermost member is removed to expose the SiC member 62. Thereafter, as shown in FIG. 12C, ohmic electrodes 68 are formed on the SiC member 63, and a heat treatment is conducted at a high temperature, whereby an ohmic contact is obtained. The ohmic electrodes 68 will function as a drain electrode and a source electrode. Furthermore, as shown in FIG. 12D, a gate electrode 69 is formed on the SiC member 62 to obtain a Schottky contact.

As a result of the above-mentioned processes, a SiC field-effect transistor with a conventional construction as shown in FIG. 6 is completed. A part of the SiC member 63 may be removed after the ohmic electrodes 68 are formed. An ohmic contact generally is obtained by inserting the SiC substrate 61 into a heating coil of a high-frequency heating furnace, and conducting a heat treatment at a high temperature of about 1000° C. to 1600° C. This method is disclosed by, for example, C. Arnodo et al., "Nickel and Molybdenum Ohmic Contacts on Silicon Carbide", Institute of Physics Conference Series Number 142, pp. 577–580, 1996 and the like.

However, according to the above-mentioned method for forming an ohmic electrode with the conventional construction, a heat-treatment temperature is much higher than heat-resistant temperatures of conventional semiconductor materials such as Si and GaAs, and the resistance of an ohmic contact thus obtained also is high. In addition, a metal material for an ohmic electrode needs to have a melting point higher than the heat-treatment temperature, so that the selection is limited to refractory metals and the like. Furthermore, this heat-treatment temperature is close to a growth temperature of SiC crystal and an annealing temperature for activation conducted after ion implantation. This may degrade the crystal structure and cause an impurity to diffuse again. In terms of facility, the conventional method also has various problems. More specifically, the conventional method requires a special apparatus such as a high-frequency heating furnace for conducting a heat treatment at a high temperature, complicated management of a temperature and an atmospheric gas, safety management with respect to a high temperature, and the like. These problems hinder the practical use and mass-production of a SiC semiconductor device.

SUMMARY OF THE INVENTION

Therefore, with the foregoing in mind, it is an object of the present invention to provide a construction in which an ohmic electrode with a low resistance is formed on a SiC substrate without conducting a heat treatment at a high temperature, and a method for producing the same.

In order to achieve the above-mentioned object, the semiconductor device of the present invention includes a SiC substrate and an ohmic electrode, wherein a semiconductor member including a SiC member and a SiGe member is formed between the SiC substrate and the ohmic electrode.

Furthermore, in the semiconductor device of the present invention, the semiconductor member may be composed of a SiGe member formed on a SiC member, and the ohmic electrode may be formed on the SiGe member.

Furthermore, in the semiconductor device of the present invention, the semiconductor member may be composed of a Si member formed on a SiC member and a SiGe member formed on the Si member, and the ohmic electrode may be formed on the SiGe member.

Furthermore, in the semiconductor device of the present invention, the semiconductor member may be composed of a semiconductor member in which a mole fraction is varied continuously from SiC to Si and from Si to SiGe, and the ohmic electrode may be formed on the semiconductor member.

Furthermore, in the semiconductor device of the present invention, the semiconductor member may be composed of a semiconductor member in which a C mole fraction is decreased while a Ge mole fraction is increased continuously from SiC to SiGe, and the ohmic electrode is formed on the semiconductor member.

Furthermore, in the semiconductor device of the present invention, the semiconductor member may be formed on both a p-type region and an n-type region.

Furthermore, in the semiconductor device of the present invention, a gate electrode may be formed on the SiC member.

Furthermore, in the semiconductor device of the present invention, the gate electrode may be formed on a Si oxide film.

Furthermore, the method for producing a semiconductor device of the present invention includes: forming a semiconductor member including a SiC member and a SiGe member on a SiC substrate by crystal growth; and forming an ohmic electrode on the semiconductor member.

Furthermore, in the method for producing a semiconductor device of the present invention, the process of forming the semiconductor member by crystal growth may include forming a SiGe member on a SiC member by crystal growth.

Furthermore, in the method for producing a semiconductor device of the present invention, the process of forming the semiconductor member by crystal growth may include forming a Si member on a SiC member by crystal growth; and forming a SiGe member on the Si member by crystal growth.

Furthermore, in the method for producing a semiconductor device of the present invention, the process of forming the semiconductor member by crystal growth may include forming a semiconductor member, in which a mole fraction is varied continuously from SiC to Si and from Si to SiGe, on a SiC member by crystal growth.

Furthermore, in the method for producing a semiconductor device of the present invention, the process of forming the semiconductor member by crystal growth may include forming a semiconductor member, in which a C mole fraction is decreased while a Ge mole fraction is increased continuously from SiC to SiGe, on a SiC member by crystal growth.

Furthermore, in the method for producing a semiconductor device of the present invention, the semiconductor member may be formed on both a p-type region and an n-type region by crystal growth.

Furthermore, the method for producing a semiconductor device of the present invention may include forming a gate electrode on the SiC member.

Furthermore, in the method for producing a semiconductor device of the present invention, the gate electrode may be formed on a Si oxide film.

According to the semiconductor device and method for producing the same of the present invention, an ohmic electrode is formed on SiGe with a small bandgap. Therefore, a heat treatment for obtaining an ohmic contact may be conducted at a very low temperature, or such a heat treatment is not required if the impurity concentration of SiGe is high enough. Furthermore, the ohmic metal can be selected from various materials, which are suitable for other fabrication processes. Needless to say, even with polysilicon in a high concentration introduced into conventional technology as wiring, an ohmic contact can be formed. Furthermore, an intrinsic semiconductor portion is not degraded due to thermal hysteresis in the course of formation of an ohmic contact, so that stable device characteristics are achieved.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of embodiments.

Embodiment 1

Figure 1:
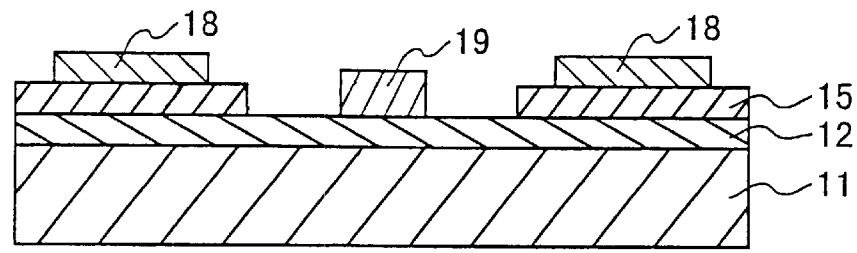
FIG. 1 is a cross-sectional view showing a configuration of a field-effect transistor of Embodiment 1 according to the present invention.

The first embodiment of the present invention will be described with reference to the drawings. FIG. 1 is a cross-sectional view showing a configuration of a SiC field-effect transistor with a first construction of the present invention. FIGS. 7A to 7D are cross-sectional views illustrating the processes of a method for producing the SiC field-effect transistor.

Figure 7A:
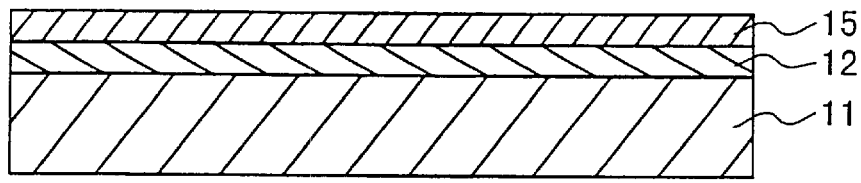
FIGS. 7A to 7D are cross-sectional views illustrating the processes of a method for producing a field-effect transistor of Embodiment 1 according to the present invention.
Figure 7B:
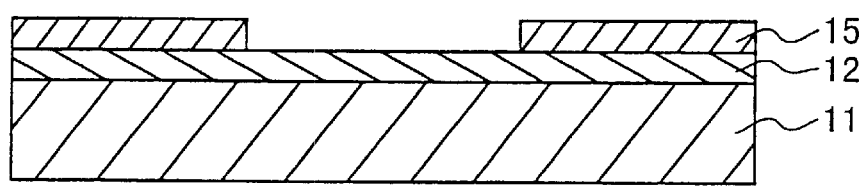
Figure 7C:
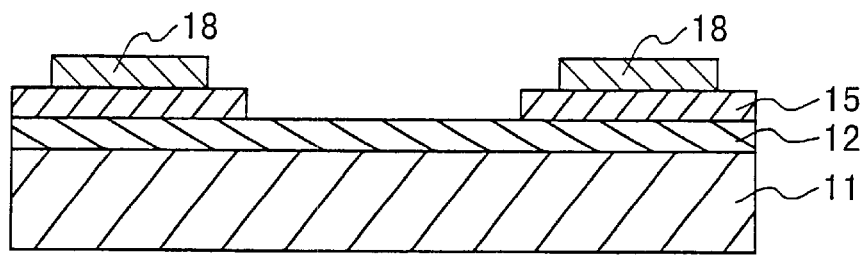
Figure 7D:
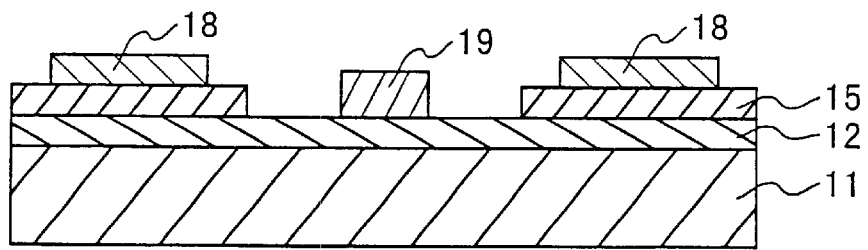

As shown in FIG. 7A, a SiC member 12 doped with an impurity in a low concentration and a SiGe member 15 doped with an impurity in a high concentration are formed on the upper surface of a SiC substrate 11 by crystal growth. Then, as shown in FIG. 7B, a part of the SiGe member 15 that is the uppermost member is removed to expose the SiC member 12. Thereafter, as shown in FIG. 7C, ohmic electrodes 18 are formed on the SiGe member 15, and a heat treatment is conducted at a low temperature of about 300° C. to obtain an ohmic contact. The ohmic electrodes 18 will function as a drain electrode and a source electrode. Furthermore, as shown in FIG. 7D, a gate electrode 19 is formed on the SiC member 12 to obtain a Schottky contact. FIG. 7D is the same as FIG. 1.

Embodiment 2

Figure 2:
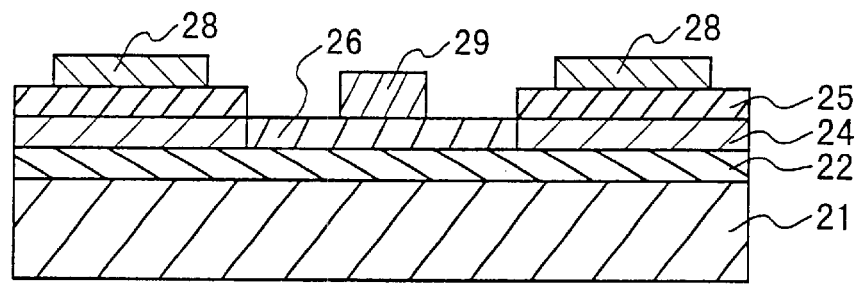
FIG. 2 is a cross-sectional view showing a configuration of a field-effect transistor of Embodiment 2 according to the present invention.

The second embodiment of the present invention will be described with reference to the drawings. FIG. 2 is a cross-sectional view showing a configuration of a SiC field-effect transistor with a second construction of the present invention. FIGS. 8A to 8E are cross-sectional views illustrating the processes of a method for producing the SiC field-effect transistor.

Figure 8A:
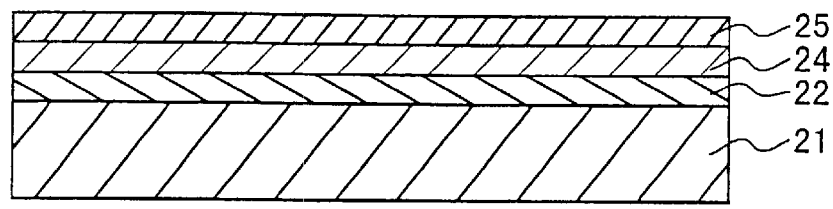
FIGS. 8A to 8E are cross-sectional views illustrating the processes of a method for producing a field-effect transistor of Embodiment 2 according to the present invention.
Figure 8B:
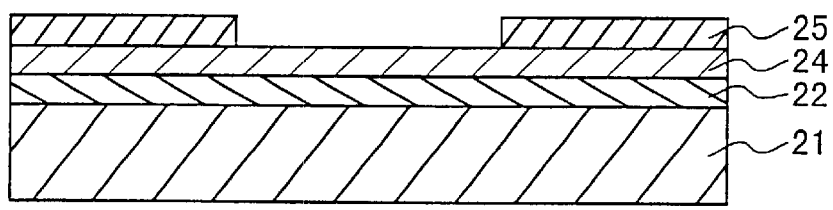
Figure 8C:
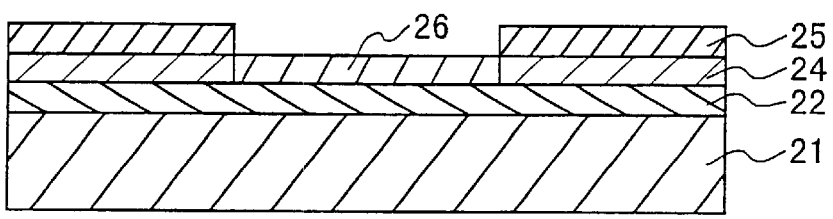
Figure 8D:
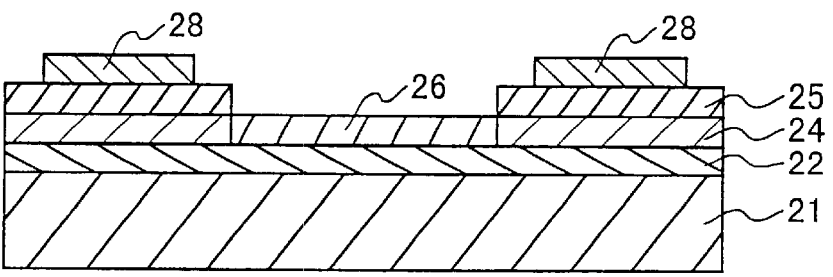
Figure 8E:
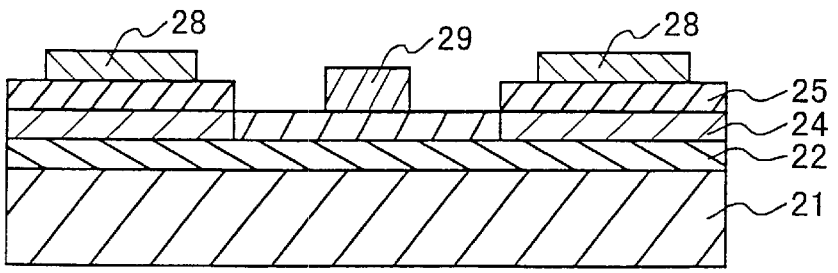

As shown in FIG. 8A, a SiC member 22 doped with an impurity in a low concentration, and a Si member 24 and a SiGe member 25 that are doped with an impurity in a high concentration are formed on the upper surface of a SiC substrate 21 by crystal growth. Then, as shown in FIG. 8B, a part of the SiGe member 25 that is the uppermost member is removed to expose the Si member 24. Thereafter, as shown in FIG. 8C, a part of the exposed Si member 24 is heat-treated at a high temperature of about 800° C. to 1000° C., whereby a gate oxide film 26 is formed. Then, as shown in FIG. 8D, ohmic electrodes 28 are formed on the SiGe member 25, and a heat treatment is conducted at a low temperature of about 300° C. to obtain an ohmic contact. Furthermore, as shown in FIG. 8E, a gate electrode 29 is formed on the gate oxide film 26 to obtain a MOS gate. FIG. 8E is the same as FIG. 2.

Embodiment 3

Figure 3:
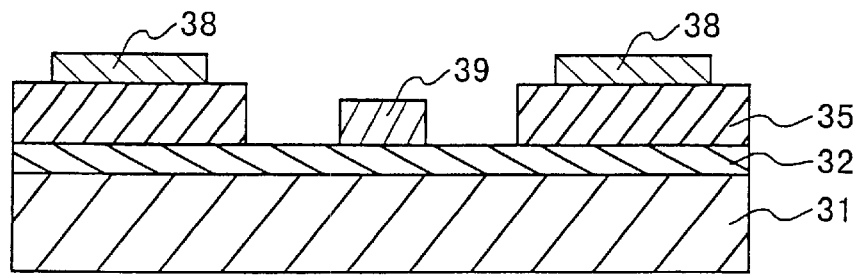
FIG. 3 is a cross-sectional view showing a configuration of a field-effect transistor of Embodiment 3 according to the present invention.

The third embodiment of the present invention will be described with reference to the drawings. FIG. 3 is a cross-sectional view showing a configuration of a SiC field-effect transistor with a third construction of the present invention. FIGS. 9A to 9D are cross-sectional views illustrating the processes of a method for producing the SiC field-effect transistor.

Figure 9A:
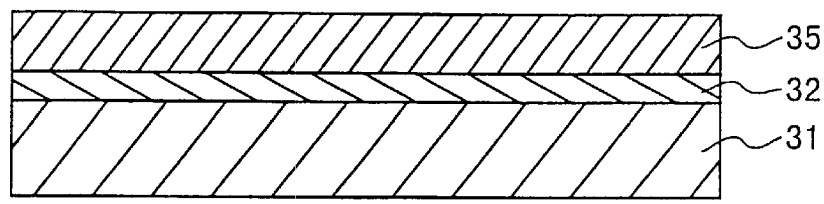
FIGS. 9A to 9D are cross-sectional views illustrating the processes of a method for producing a field-effect transistor of Embodiment 3 according to the present invention.
Figure 9B:
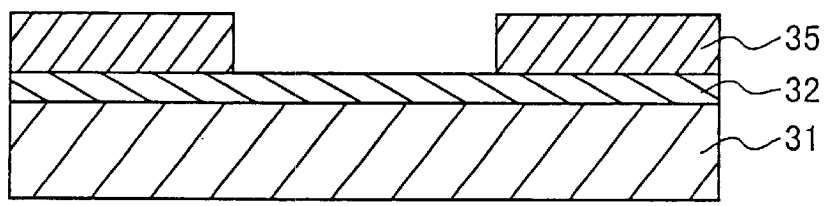
Figure 9C:
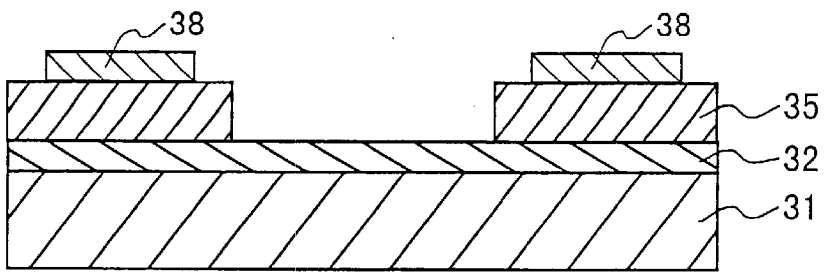
Figure 9D:
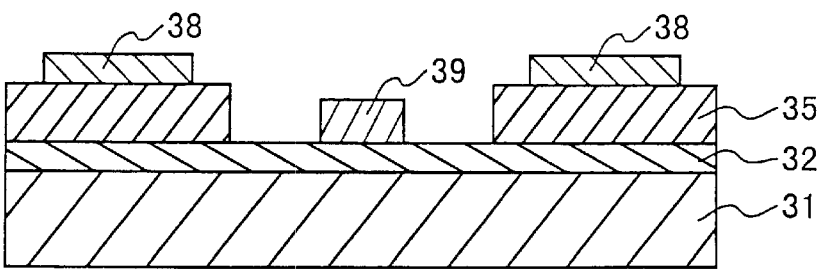

As shown in FIG. 9A, a SiC member 32 doped with an impurity in a low concentration and a SiC/Si/SiGe mixed crystal member 35 doped with an impurity in a high concentration are formed on the upper surface of a SiC substrate 31 by crystal growth. The mixed crystal member 35 is formed in such a manner that a C mole fraction is decreased continuously from SiC to Si from the substrate side and a Ge mole fraction is increased continuously from Si to SiGe. Next, as shown in FIG. 9B, a part of the mixed crystal member 35 that is the uppermost member is removed to expose the SiC member 32. Thereafter, as shown in FIG. 9C, ohmic electrodes 38 are formed on the mixed crystal member 35, and a heat treatment is conducted at a low temperature of about 300° C. to obtain an ohmic contact. Furthermore, as shown in FIG. 9D, a gate electrode 39 is formed on the SiC member 32 to obtain a Schottky contact. FIG. 9D is the same as FIG. 3.

Embodiment 4

Figure 4:
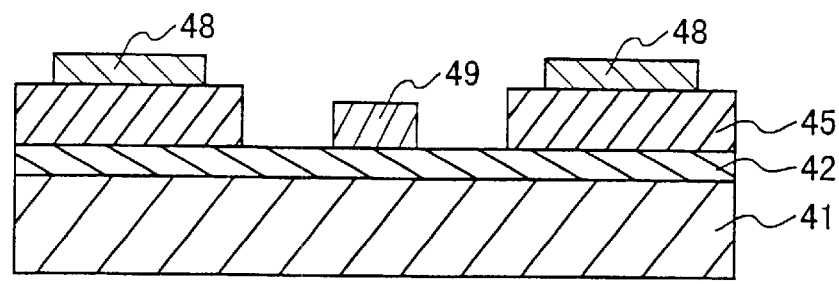
FIG. 4 is a cross-sectional view showing a configuration of a field-effect transistor of Embodiment 4 according to the present invention.

The fourth embodiment of the present invention will be described with reference to the drawings. FIG. 4 is a cross-sectional view showing a configuration of a SiC field-effect transistor with a fourth construction of the present invention. FIGS. 10A to 10D are cross-sectional views illustrating the processes of a method for producing the SiC field-effect transistor.

Figure 10A:
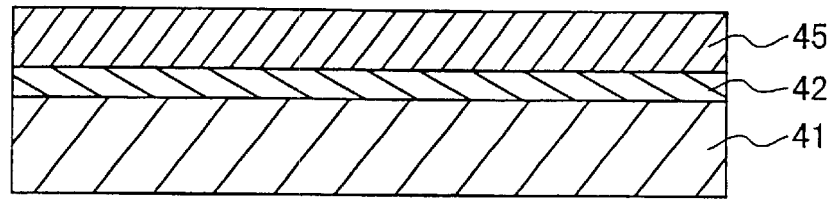
FIGS. 10A to 10D are cross-sectional views illustrating the processes of a method for producing a field-effect transistor of Embodiment 4 according to the present invention.
Figure 10B:
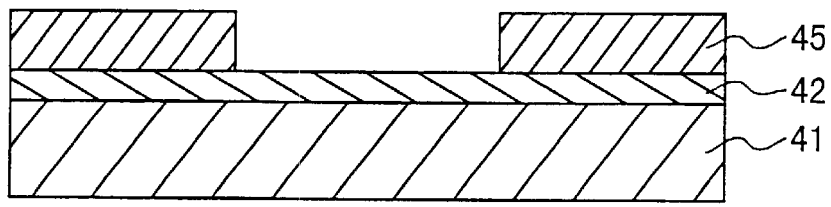
Figure 10C:
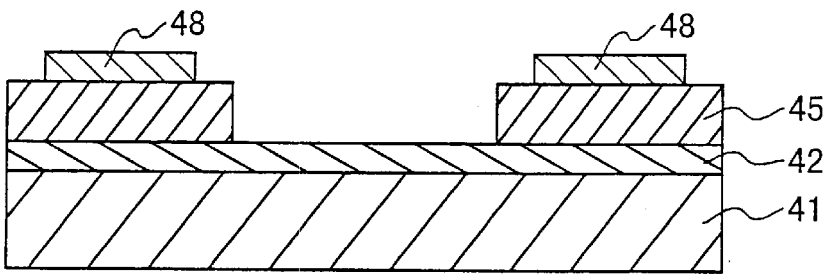
Figure 10D:
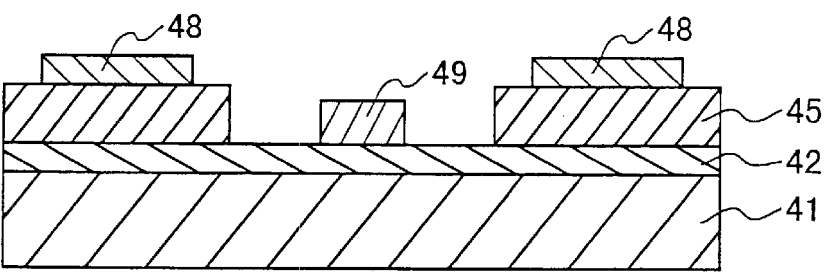

As shown in FIG. 10A, a SiC member 42 doped with an impurity in a low concentration and a SiC—SiGe mixed crystal member 45 doped with an impurity in a high concentration are formed on the upper surface of the SiC substrate 41 by crystal growth. The mixed crystal member 45 is composed of a member formed by decreasing a C mole fraction while increasing a Ge mole fraction continuously from SiC to SiGe from the substrate side. Next, as shown in FIG. 10B, a part of the mixed crystal member 45 that is the uppermost member is removed to expose the SiC member 42. Thereafter, as shown in FIG. 10C, ohmic electrodes 48 are formed on the mixed crystal member 45, and a heat treatment is conducted at a low temperature of about 300° C. to obtain an ohmic contact. Furthermore, as shown in FIG. 10D, a gate electrode 49 is formed on the SiC member 42 to obtain a Schottky contact. FIG. 10D is the same as FIG. 4.

Embodiment 5

Figure 5:
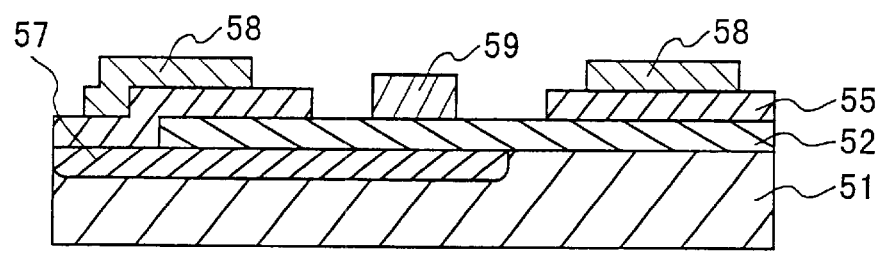
FIG. 5 is a cross-sectional view showing a configuration of a field-effect transistor in which a part of Embodiment 1 according to the present invention is modified.
Figure 6:
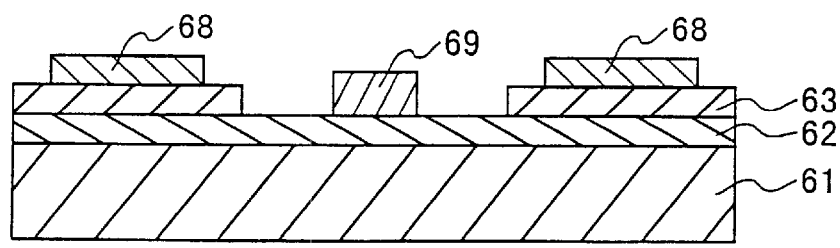
FIG. 6 is a cross-sectional view showing a configuration of a field-effect transistor with a conventional construction.

The fifth embodiment of the present invention will be described with reference to the drawings. FIG. 5 is a cross-sectional view showing a configuration of a SiC field-effect transistor in which a part of the first construction of the present invention is modified. FIGS. 11A to 11E are cross-sectional views illustrating the processes of a method for producing the SiC field-effect transistor.

Figure 11A:
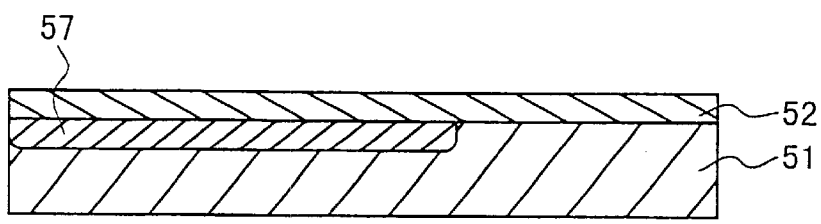
FIGS. 11A to 11E are cross-sectional views illustrating the processes of a method for producing a field-effect transistor in which a part of Embodiment 1 according to the present invention is modified.
Figure 11B:
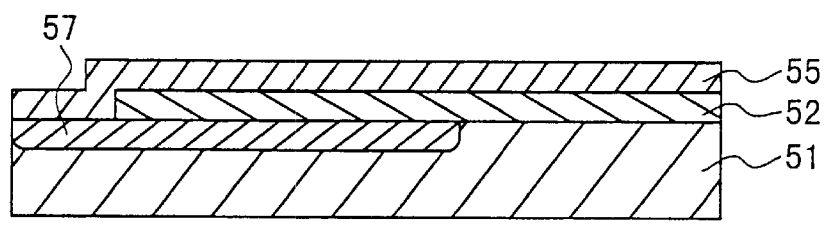
Figure 11C:
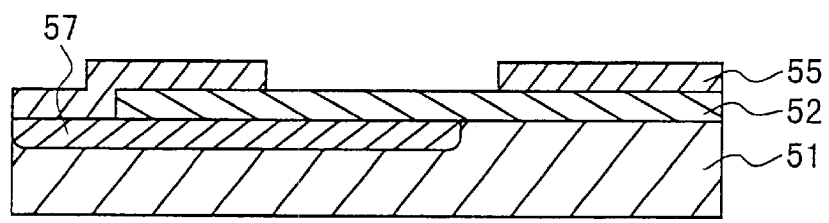
Figure 11D:
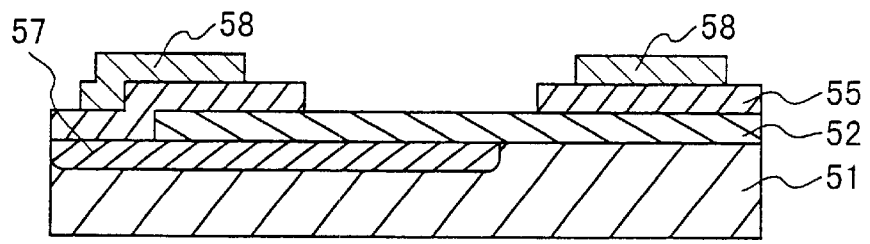
Figure 11E:
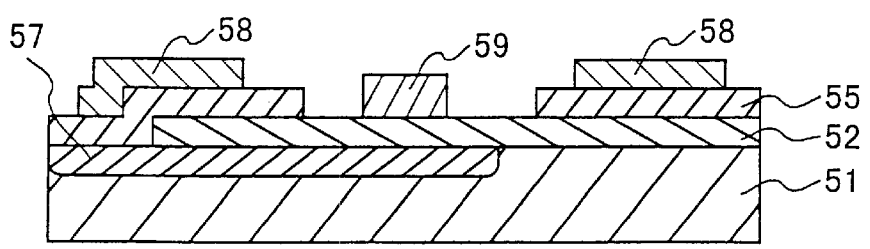
Figure 12A:
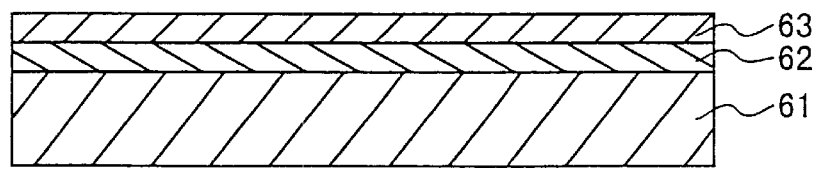
FIGS. 12A to 12D are cross-sectional views illustrating the processes of a method for producing a field-effect transistor with a conventional construction.
Figure 12B:
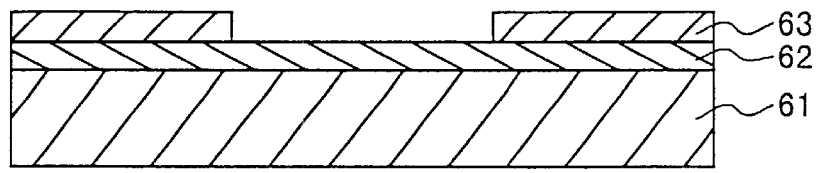
Figure 12C:
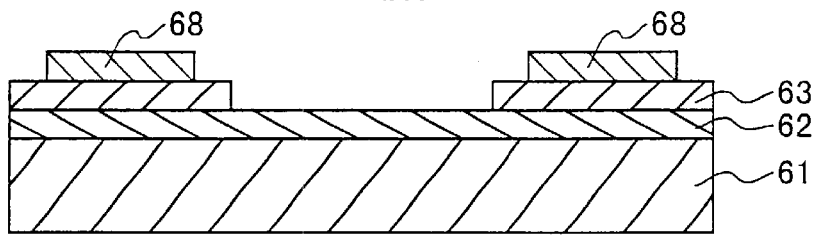
Figure 12D:
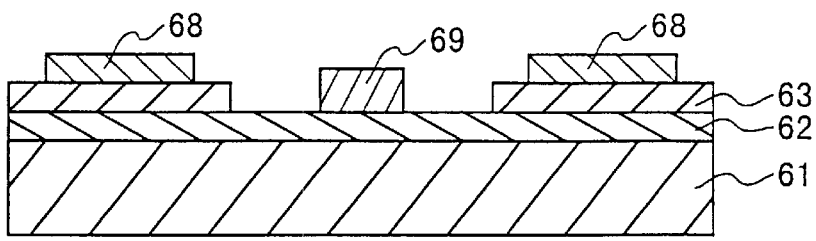

As shown in FIG. 11A, a SiC member 52 doped with an impurity in a low concentration is formed on the upper surface of a SiC substrate 51 by crystal growth. Thereafter, an impurity with a conductivity opposite to that of the SiC member 52 (more specifically, a p-type impurity in the case where the SiC member 52 has an n-type conductivity) is implanted from the surface side by ion implantation to form an impurity-buried region 57. The resultant stack is heat-treated at about 1000° C. to activate the impurity-buried region 57. Thereafter, as shown in FIG. 11B, a part of the SiC member 52 on the impurity-buried region 57 is removed to expose the impurity-buried region 57. A SiGe member 55 doped with an impurity in a high concentration is formed on the SiC member 52 and the exposed impurity-buried region 57 by crystal growth. At this time, a pn-junction is provided on the impurity-buried region 57; however, SiGe has a very narrow bangap with respect to SiC, so that the difference in conductivity is substantially negligible. If it is desired to improve a resistivity, it only is necessary to allow an impurity with the same conductivity to diffuse again into a part of the SiGe member 55 on the impurity-buried region 57. Next, as shown in FIG. 11C, a part of the SiGe member 55 that is the uppermost member is removed to expose the SiC member 52. Thereafter, as shown in FIG. 11D, ohmic electrodes 58 are formed on the SiGe member 55, and a heat treatment is conducted at a low temperature of about 300° C. to obtain an ohmic contact. Furthermore, as shown in FIG. 11E, a gate electrode 59 is formed on the SiC member 52 to obtain a Schottky contact. FIG. 11E is the same as FIG. 5.

In the above-mentioned Embodiments 1 to 5, an ohmic electrode is formed by heat treatment at about 300° C. However, it is possible to increase the temperature of the heat treatment up to about 500° C.

In order to further clarify the effects obtained by the construction of the present invention, description will be made with reference to band diagrams of a semiconductor. FIGS. 13A to 13D are band diagrams showing a junction between an n-type semiconductor and metal, and FIGS. 14A to 14D are band diagrams showing a junction between a p-type semiconductor and metal.

Figure 13A:
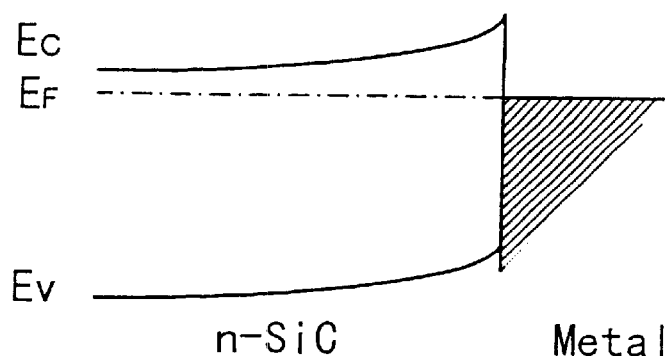
FIGS. 13A to 13D are schematic views of semiconductor/metal band diagrams when an ohmic contact is formed on an n-type semiconductor.

FIG. 13A shows a junction between n-type SiC (n-SiC) and metal. As is apparent from the figure, in the case of SiC with a very large bandgap, a Schottky barrier is high, so that the contact resistance is not decreased even if an impurity concentration is increased slightly. Furthermore, since the crystal itself is very hard as described above, a heat treatment at a very high temperature is required for breaking the Schottky barrier.

Figure 13B:
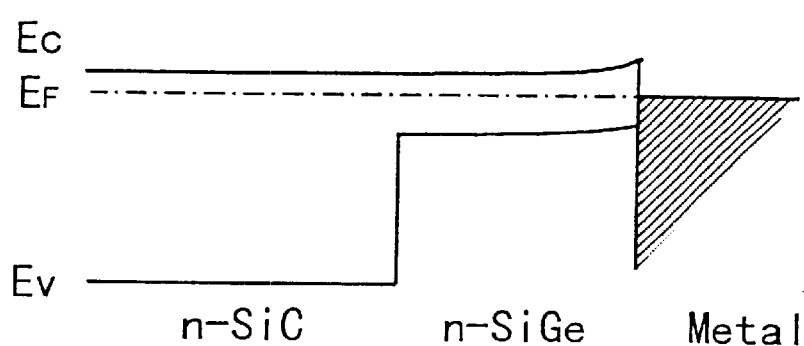

In contrast, in FIG. 13B showing the first construction of the present invention, since a semiconductor with a very small bandgap, such as SiGe, is used, a Schottky barrier can be lowered. Furthermore, when a semiconductor with a small bandgap is doped with an impurity in a high concentration, the semiconductor almost is metallized. Therefore, even if the semiconductor is brought into contact with metal at room temperature, an ohmic contact is formed therebetween, which makes it possible to form a so-called non-alloy contact.

Figure 13C:
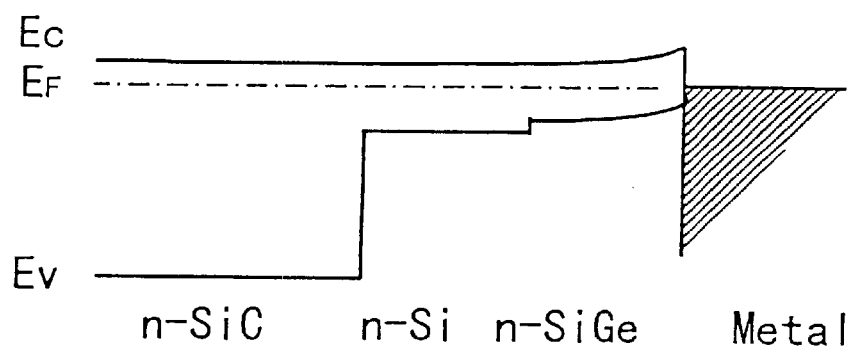

FIG. 13C shows the second construction of the present invention, in which Si is interposed between SiC and SiGe. This shows a more practical construction. In the present crystal growth technique, it is found that more satisfactory crystal is likely to be obtained in the case where Si is formed from SiC and SiGe is formed from Si, compared with the case where SiGe is grown abruptly from SiC. This mainly is ascribed to the lattice constant difference, the substrate temperature, the kind of a gas to be used, and the like.

Furthermore, as described in Embodiment 2 shown in FIG. 2, it also may be possible to form a MOS structure by allowing interposed Si to be self-oxidized. In general, it is found that when SiC itself is oxidized, C remains on an interface, which makes it difficult to obtain a satisfactory MOS structure. In the present construction, this problem also is overcome.

Figure 13D:
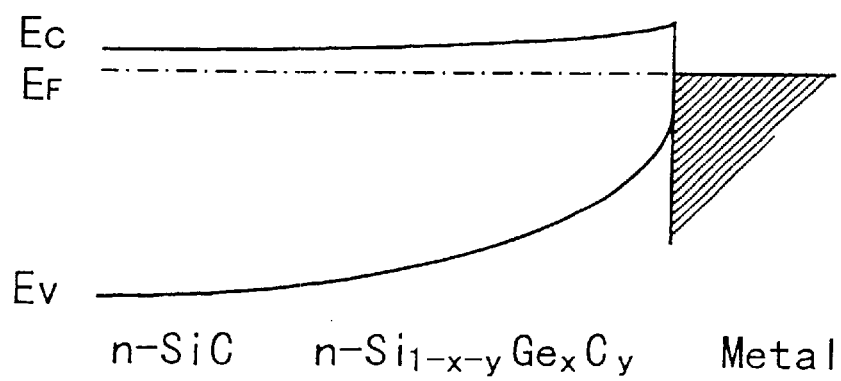

FIG. 13D shows the fourth construction of the present invention, in which a C mole fraction is decreased successively from a SiC interface while a Ge mole fraction is increased successively, whereby a bandgap is varied continuously. Although this crystal growth technique is most difficult, it is most excellent in electrical continuity. According to the third construction of the present invention, crystal growth is conducted more easily, in which a C mole fraction is decreased successively from SiC to form Si, and a Ge mole fraction increased successively in Si to obtain SiGe. This method also is excellent in electrical continuity.

Figure 14A:
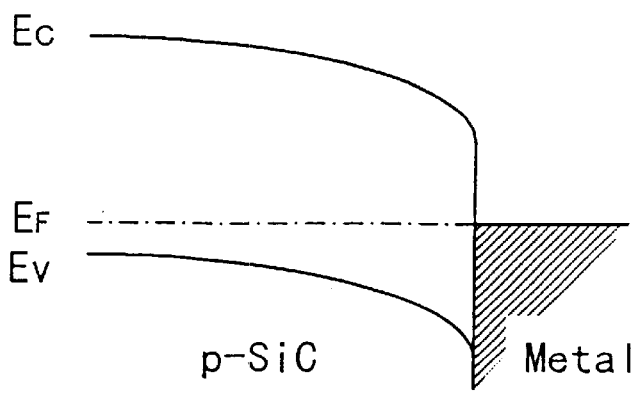
FIGS. 14A to 14D are schematic views of semiconductor/metal band diagrams when an ohmic contact is formed on a p-type semiconductor.

The above description substantially applies to the case of a p-type. However, as shown in FIG. 14A, SiC is not activated even if the concentration of a p-type impurity is increased, so that a p-type with a high concentration cannot be obtained. Therefore, a contact resistance becomes higher than that of an n-type.

Figure 14B:
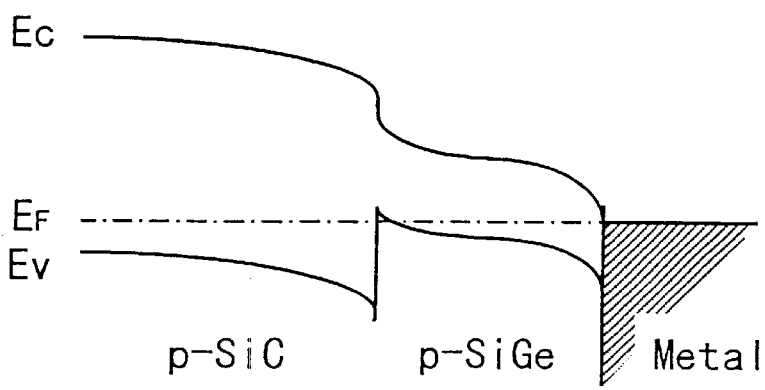
Figure 14C:
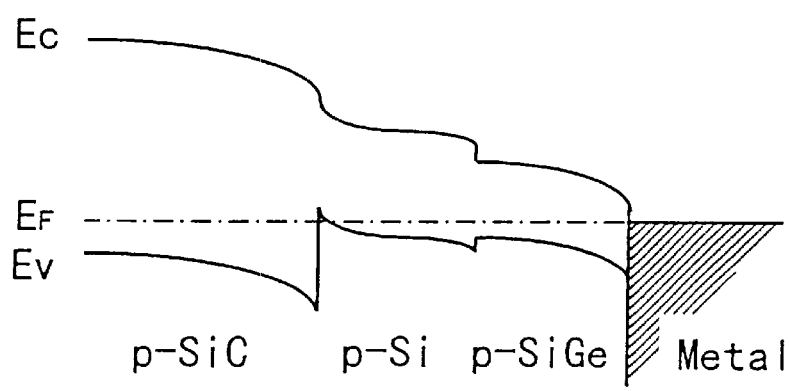
Figure 14D:
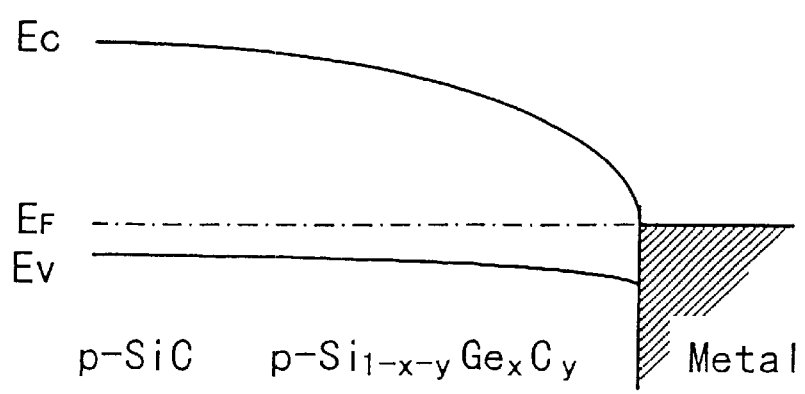

FIGS. 14B to 14D show the case where an n-type in FIGS. 13B to 13D is changed to a p-type. The effect of interposing SiGe is greater in a p-type. Particularly, in the construction shown in FIG. 14D in which electrical continuity is obtained, a barrier is not present in a semiconductor, so that a contact resistance can be reduced remarkably.

SiC is a semiconductor with a wide bandgap, and is considered to operate at a high voltage using this feature in practical use. Under a high electric field, unnecessary electron-hole pairs are generated by an avalanche effect between a gate and a drain. As in a SiMOSFET for power, a p-sinker absorbing the holes is required. However, if it is difficult to form a satisfactory contact with respect to a p-type as described above, the p-sinker does not function sufficiently. The construction described in Embodiment 5 solves this problem. In this construction, SiGe with a small bandgap is interposed, whereby n-SiC is connected to p-SiC at a low resistance, whereby holes generated under the gate are recombined in SiGe.

According to the semiconductor device and method for producing the same of the present invention, an ohmic electrode is formed on SiGe with a small bandgap. Therefore, a heat treatment for obtaining an ohmic contact may be conducted at a very low temperature, or such a heat treatment is not required if the impurity concentration of SiGe is high enough. Furthermore, the ohmic metal can be selected from various materials, which are suitable for other fabrication processes. Needless to say, even with polysilicon in a high concentration introduced into conventional technology as wiring, an ohmic contact can be formed. Furthermore, an intrinsic semiconductor portion is not degraded due to thermal hysteresis in the course of formation of an ohmic contact, so that stable device characteristics are achieved.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A field-effect transistor comprising a source electrode, a drain electrode, and a gate electrode, wherein the gate electrode is formed on a SiC layer doped with an impurity in a low concentration, and is in Schottky contact with the SiC layer, and the source electrode and the drain electrode are formed on the SiC layer via a SiGe layer doped with an impurity in a concentration higher than the SiC layer.

2. A field-effect transistor comprising a source electrode, a drain electrode, and a gate electrode, wherein the gate electrode is formed on a SiC layer doped with an impurity in a low concentration, via a Si oxide film, and is in Schottky contact with the SiC layer, and the source electrode and the drain electrode are formed on the SiC layer via a Si layer and a SiGe layer, the SiGe layer being formed on the Si layer, and the Si and SiGe layers being doped with an impurity in a concentration higher than the SiC layer.

3. A field-effect transistor comprising a source electrode, a drain electrode, and a gate electrode, wherein the gate electrode is formed on a SiC layer doped with an impurity in a low concentration, and is in Schottky contact with the SiC layer, the source electrode and the drain electrode are formed on the SiC layer via a semiconductor layer doped with an impurity in a concentration higher than the SiC layer, and the semiconductor layer has a composition that varies continuously in mole fraction from SiC to Si and further from Si to SiGe.

4. A field-effect transistor comprising a source electrode, a drain electrode, and a gate electrode, wherein the gate electrode is formed on a SiC layer doped with an impurity in a low concentration, and is in Schottky contact with the SiC layer, and the source electrode and the drain electrode are formed on the SiC layer via a semiconductor layer doped with an impurity in a concentration higher than the SiC layer, and the semiconductor layer has a composition that varies in mole fraction, in which a C mole fraction is decreased continuously while a Ge mole fraction is increased continuously from SiC to SiGe.

5. A field-effect transistor comprising a source electrode, a drain electrode, and a gate electrode, wherein the gate electrode is formed on a SiC layer of first conductivity doped with an impurity in a low concentration, and is in Schottky contact with the SiC layer of first conductivity, and a first electrode, the first electrode being one of the source electrode and the drain electrode, is formed on the SiC layer of first conductivity via a first SiGe layer of first conductivity doped with an impurity in a concentration higher than the SiC layer of first conductivity, and a second electrode, the second electrode being the one of the source electrode and the drain electrode not selected as the first electrode, is formed on the SiC layer of first conductivity and a SiC layer of second conductivity that is adjacent to the SiC layer of first conductivity via a second SiGe layer of first conductivity doped with an impurity in a concentration higher than the SiC layer of first conductivity.

* * * * *